US008837752B2

(12) United States Patent
Fujita et al.

(10) Patent No.: US 8,837,752 B2
(45) Date of Patent: Sep. 16, 2014

(54) MIXING APPARATUS

(75) Inventors: Hiroaki Fujita, Hamamatsu (JP); Satoshi Sendoh, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 355 days.

(21) Appl. No.: 13/429,133

(22) Filed: Mar. 23, 2012

(65) Prior Publication Data

US 2012/0243711 A1 Sep. 27, 2012

(30) Foreign Application Priority Data

Mar. 25, 2011 (JP) .................................. 2011-67369
Mar. 2, 2012 (JP) .................................. 2012-46239

(51) Int. Cl.
*H04B 1/00* (2006.01)
*H03G 3/00* (2006.01)

(52) U.S. Cl.
USPC ........................................... 381/119; 381/61

(58) Field of Classification Search
CPC .............................. H04H 60/04; G11B 27/031
USPC .................... 381/119, 61, 80; 700/94; 84/625
See application file for complete search history.

(56) References Cited

FOREIGN PATENT DOCUMENTS

| | | | | |
|---|---|---|---|---|
| JP | 2005-252328 | A | | 9/2005 |
| JP | 2005252328 | A | * | 9/2005 |

* cited by examiner

*Primary Examiner* — Vivian Chin
*Assistant Examiner* — Ammar Hamid
(74) *Attorney, Agent, or Firm* — Morrison & Foerster LLP

(57) ABSTRACT

In an automatic correction process, automatic correction processing portions 60 are connected to a set reference channel and target channels, respectively, so that test signals will be input to the automatic correction processing portions 60, respectively. A rise detection portion 60*a* detects a rise in a test signal input to a corresponding channel, so that a value counted by a sample counter 61 is latched by a latch 60*b* at the rising timing of this test signal. In accordance with a difference between the counted value latched to the reference channel and the counted value latched to the target channel, a time difference is calculated. In accordance with the time difference, a delay time set for a channel delay means of the target channel is automatically corrected.

13 Claims, 9 Drawing Sheets

MIXING APPARATUS

BACKGROUND OF THE INVENTION

1. Field of the Invention

The present invention relates to a mixing apparatus having an automatic delay correction capability of automatically adjusting delay time in order to eliminate time differences among a plurality of input signals.

2. Description of the Related Art

Conventionally, there is a known mixing apparatus which mixes tones collected by a multiplicity of microphones and transmits the mixed tones to power amplifiers and various recoding apparatuses or transmits the mixed tones to effectors and players playing music (see Japanese Unexamined Patent Publication No. 2005-252328, for example). By manipulating operating elements, an operator who manipulates the mixing apparatus controls the tone volume or the timbre of tones of musical instruments or singing voices collected by the microphones so that the musical performance will be expressed most appropriately. The mixing apparatus has a plurality of input channels, a mix bus for mixing signals input from the input channels, and an output channel for outputting the mixed signals. The respective input channels control the frequency characteristic (the frequency response characteristic), the mixing level and the like of input signals before outputting the controlled signals to the mix bus, whereas the mix bus mixes supplied signals and then outputs the mixed signals to the output channel. The output channel controls the level and the like of the mixed signals input from the mix bus and then outputs the controlled signals.

In the conventional mixing apparatus, an audio processing portion of each input channel controls the level and the frequency characteristic of input signals. The audio processing portion has a delay means, so that input signals are delayed by a certain period of time by the delay means. The reason why input signals are delayed by the delay means is because the input signals which are the signals of a tone collected by microphones have time differences among the input signals depending on respective differences in distance between a tone generator and respective locations of the microphones, so that the mixing of the input signals without delay may cause ill effect on the quality of tones due to the phase shifts caused by the time differences in the input signals. By adjusting respective delay times set for the respective delay means among the respective input channels, therefore, the conventional mixing apparatus eliminates the time differences in input signals among the input channels so that the signals will be in phase with each other.

Although the conventional mixing apparatus is provided with the delay means for each input channel in order to adjust the phase of input signals, the user has to manually specify respective delay times for the input channels while listening to mixed tones. Therefore, the conventional mixing apparatus is disadvantageous in that in a case where there are a multiplicity of input channels, the user is required to follow complicated and time-consuming procedures of specifying delay times for the respective input channels in order to adjust delay times for the respective input channels. In addition, there is a disadvantage that it is difficult for the user to adjust the delay times so that input signals will be in phase with each other.

SUMMARY OF THE INVENTION

The present invention was accomplished to solve the above-described disadvantages, and an object thereof is to provide a mixing apparatus which allows simple and precise settings of delay times for respective input channels.

In order to achieve the above-described object, the present invention provides a mixing apparatus having a plurality of input channels which receive a plurality of audio signals from a plurality of microphones, respectively, the mixing apparatus controlling characteristic of the input audio signals in the input channels, respectively, mixing the audio signals received by the input channels to obtain a mixed audio signal and then outputting the mixed audio signal, the mixing apparatus including a plurality of delay portions which are provided for the input channels, respectively, and delay the input audio signals, respectively; a first designation portion which designates one of the input channels as a reference channel; a second designation portion which designates at least one of the input channels as a target channel; a time difference detector which detects a time difference of timing at which the target channel receives an audio signal representative of a test tone generated by a single tone generator and collected by one of the microphones which supplies audio signals to the target channel, from timing at which the reference channel receives an audio signal representative of the test tone collected by another one of the microphones which supplies audio signals to the reference channel; and a delay controller which controls the respective delay portions provided for the reference channel and the target channel in accordance with the time difference, detected by the time difference detector, in the timing at which the audio signals are received so that the difference in the timing at which the reference channel and the target channel receive the audio signals, respectively, will be eliminated.

In this case, the reference channel and the target channel are designated by user's manipulation. Furthermore, the characteristic of audio signals is frequency characteristic, level characteristic, and phase characteristic of the audio signals.

According to the present invention configured as described above, the time difference detector detects a time difference of the timing at which the target channel receives an audio signal representative of the test tone from the timing at which the reference channel receives an audio signal representative of the test tone. The delay controller controls the respective delay portions provided for the reference channel and the target channel in accordance with the detected time difference to eliminate the difference in timing at which the audio signals are received by the reference channel and the target channel. As a result, the characteristic of the audio signals is automatically adjusted so that the time difference caused by the variations in location of the microphones from which the audio signals are input to the reference channel and the target channel, respectively, that it, the phase difference will be eliminated to facilitate user's jobs regarding the time difference.

DESCRIPTION OF THE PREFERRED EMBODIMENT

Figure 1:
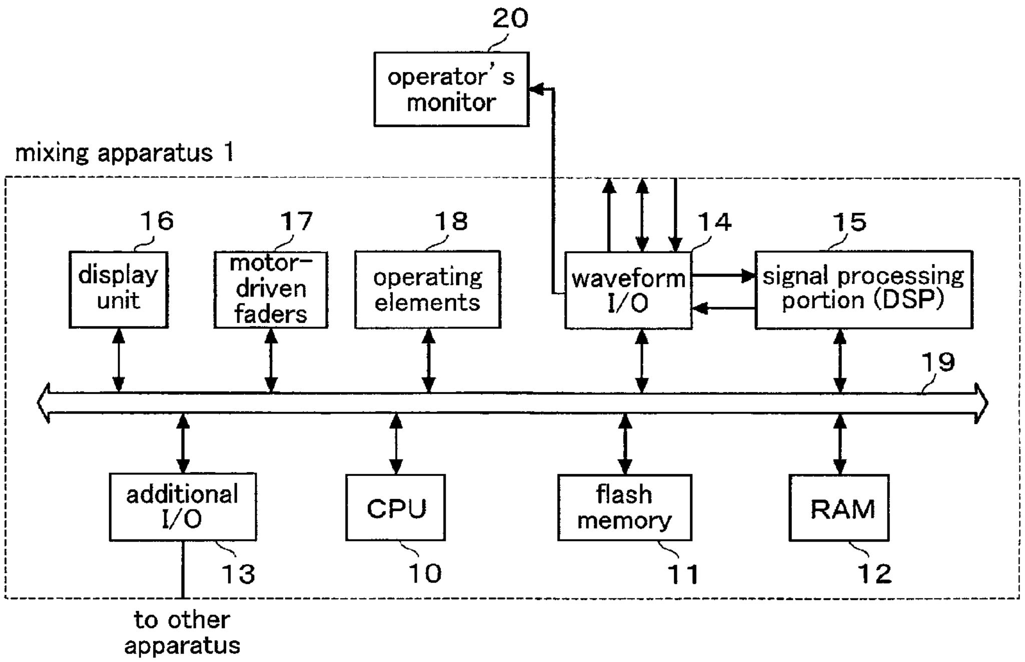
FIG. 1 is a block diagram indicative of a configuration of a mixing apparatus according to an embodiment of the present invention.

FIG. 1 is a block diagram indicative of a configuration of a mixing apparatus 1 of an embodiment of the present invention.

The mixing apparatus 1 according to the embodiment of the invention shown in FIG. 1 has a CPU (central processing unit) 10 which controls the entire operation of the mixing apparatus 1 and generates control signals in accordance with manipulations of mixing operating elements, a nonvolatile rewritable flash memory 11 in which operating software such as a mixing control program executed by the CPU 10 is stored, and a RAM (random access memory) 12 having a working area for the CPU 10, in which various kinds of data and the like are stored. By storing the operating software in the flash memory 11, as described above, the mixing apparatus 1 allows rewriting of the operating software stored in the flash memory 11 to update the operating software. In addition, the other apparatuses such as a digital recorder can be connected to the mixing apparatus 1 through an additional I/O 13 which is an input/output interface.

Each input and output on the mixing apparatus 1 is done through a waveform I/O (waveform data interface) 14. For input, the waveform I/O 14 has a plurality of analog input ports each of which is provided with an A/D converter for converting analog signals input from an external microphone or the like to digital signals, and a plurality of digital input ports to which digital signals are externally input. For output, the waveform I/O 14 has a plurality of analog output ports each of which is provided with a D/A converter for converting digital signals to analog signals, and a plurality of digital output ports for outputting digital signals. Furthermore, the waveform I/O 14 also has a monitoring port for outputting analog monitoring signals. The monitoring signals are supplied to an operator's monitor 20 from the monitoring port to allow an operator situated in an operator room to check signals of an input channel or an output channel, or signals output from an output channel to be supplied to speakers or the like without changing a current mixing state. Furthermore, a signal processing portion 15 is formed of a multiplicity of DSPs (digital signal processors) to carry out mixing processing and effect processing under the control of the CPU 10.

A display unit 16 is a display including a liquid crystal display device for displaying a screen such as a screen for adjusting various parameters including delay parameters for input channels and an automatic correction screen for automatically correcting the delay parameters. Motor-driven faders 17, which are the faders for controlling the output level of signals which are to be transmitted to mix buses such as a stereo bus (ST bus) and the output level of signals output from the buses, are hand-operated or motor-driven. Operating elements 18 are formed of assignment switches for assigning 12 channel strips to either input channels 1 to 12 or input channels 13 to 24, cursor-movement keys for moving a cursor on a screen displayed on the display unit 16, increase/decrease keys for increasing or decreasing a value which is to be set, a rotary encoder for selecting a value which is to be set, an enter key for entering a set value, and the like. The respective components are connected to a bus 19.

Figure 2:
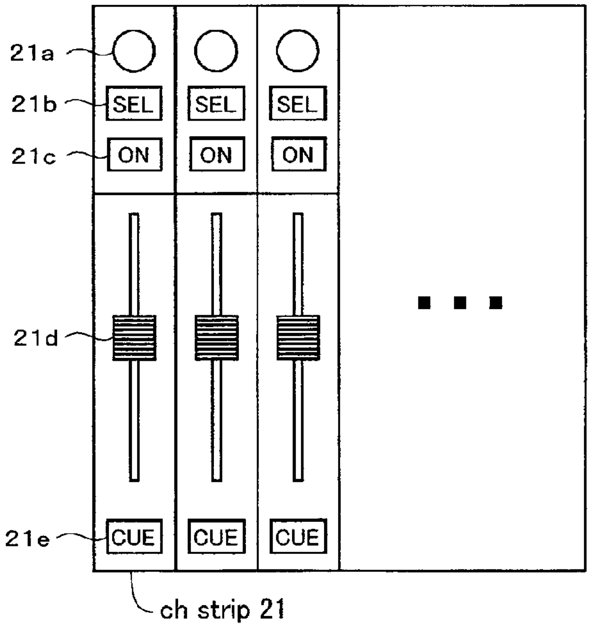
FIG. 2 is a diagram indicative of a configuration of channel strips of the mixing apparatus of the invention.

FIG. 2 indicates a configuration of channel (ch) strips provided on a panel of the mixing apparatus 1 of the invention.

Although channel strips 21 shown in FIG. 2 are actually provided for twelve channels, FIG. 2 indicates only the channel strips 21 for three of the twelve channels. The respective channel strips 21 are configured similarly. More specifically, each channel strip 21 has a knob 21*a* for controlling a certain parameter of a channel assigned to the channel strip 21, an SEL key 21*b* which is to be manipulated in order to select a channel which the operator desires to manipulate and is to illuminate in a state where the channel has been selected, an ON key 21*c* which is to be manipulated in order to turn on the channel and is to illuminate in a state where the channel is in the on-state, a fader 21*d* which is the motor-driven fader 17 for controlling the input level of the channel, and a CUE key 21*e* which is to be manipulated in order to queue the channel and is to illuminate in a state where the CUE key 21*e* is in the on-state. These channel strips 21, which correspond to all the input channels or all the output channels, respectively, can be assigned to the 12 input channels or the 12 output channels so that the channel strips 21 can control the assigned channels, respectively.

By use of the channel strips 21, a reference channel and target channels used in a later-described automatic correction process can be specified. By depressing the SEL key 21*b* of the channel strip 21 to which an input channel which the operator desires to define as the reference channel is assigned to illuminate the SEL key 21*b* of the channel strip 21, for example, the input channel is defined as the reference channel. By depressing the SEL key 21*b* of the channel strip 21 to which an input channel which the operator desires to define as a target channel is assigned while depressing the SEL key 21*b* of the channel strip of the reference channel, furthermore, the SEL key 21*b* of the input channel which the operator desires to define as a target channel blinks, so that the input channel having the blinking SEL key 21*b* is defined as a target channel. The mixing apparatus 1 can have a plurality of target channels.

Figure 3:
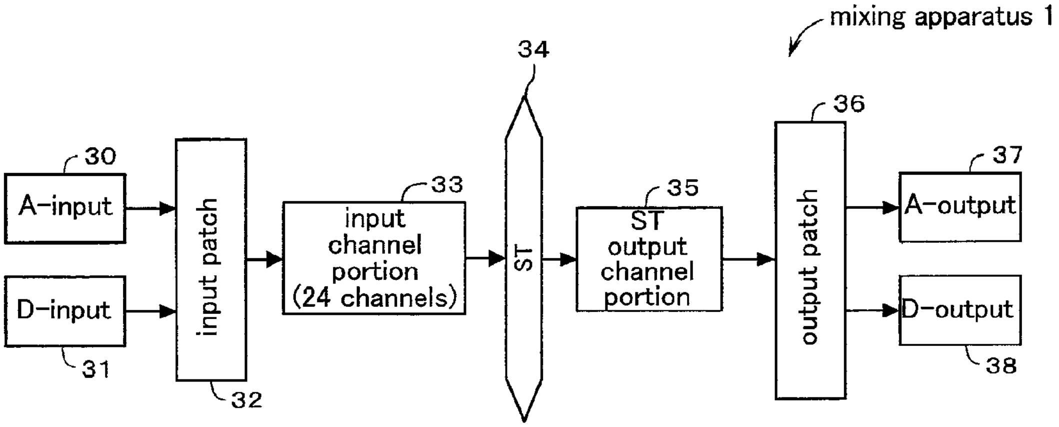
FIG. 3 is a functional block diagram equivalently indicating a processing algorithm of a signal processing portion and a waveform I/O of a mixing apparatus of the invention.

FIG. 3 is a functional block diagram equivalently indicating a processing algorithm of the signal processing portion (DSP) 15 and the waveform I/O 14 of the mixing apparatus 1 of the invention having the configuration shown in FIG. 1.

In FIG. 3, analog signals input from external microphones or the like to a plurality of analog input ports (A-input) 30 are converted to digital signals by the A/D converters integrated into the waveform I/O 14 to be input to an input patch 32. Digital signals input to a plurality of digital input ports (D-input) 31 are directly input to the input patch 32. The input patch 32 selectively patches (connects) one input port of the plurality of input ports from which signals are input to an input channel of an input channel portion 33 which has 24 channels, for example. To an input channel of the input channel portion 33, more specifically, signals transmitted from an input port patched by the input patch 32 are supplied.

Each input channel of the input channel portion 33 has a limiter, a compressor, an equalizer (EQ), a delay means, a fader and a send-control portion which controls the send level to a stereo (ST) bus 34 so that each input channel can adjust frequency balance, level-control and send-level to the ST bus 34. Digital signals for 24 channels output from the input channel portion 33 are selectively output to either a bus for L ch or a bus for R ch of the ST bus 34. In the ST bus 34, one or more digital signals selectively input from a given input channel/channels of the 24 input channels are mixed for L ch and R ch, respectively, so that the mixed outputs from the L ch and the R ch are output to an ST output channel portion 35. Each output channel of the L ch and the R ch of the ST output channel portion 35 has a limiter, a compressor, an equalizer, a fader and the like so that each output channel can adjust frequency balance, level-control and send-level to an output patch 36. The output patch 36 selectively patches stereo signals input from the ST output channel portion 35 to output ports of an analog output port portion (A-output) 37 and a digital output port portion (D-output) 38. To an output port, more specifically, signals transmitted from a channel patched by the output patch 36 are supplied.

The digital output signals supplied to the analog output port portion (A-output) 37 having a plurality of analog output ports are converted by D/A converters integrated into the waveform I/O 14 to analog output signals to be output from analog output ports. The analog output signals output from the analog output port portion (A-output) 37 are then amplified and emitted from a main speaker. Furthermore, these analog output signals are also supplied to in-ear monitors worn by performers, and reproduced by stage monitoring speakers placed near the performers. Digital audio signals output from the digital output port portion (D-output) 38 having a plurality of digital output ports can be supplied to a recorder, an externally connected DAT or the like to be digitally recorded.

The signal processing portion 15 of the mixing apparatus 1 carries out signal processing corresponding to a parameter set formed of signal processing parameters specified for the input channels and the output channels by use of the operating elements 18 such as the faders, knobs and switches provided on the panel. When the audio output is emitted by the mixing apparatus 1, more specifically, audio settings corresponding to the parameter set are created by the signal processing portion 15. Furthermore, part of the later-described automatic correction process for correcting delay time is carried out by a DSP of the signal processing portion 15.

Figure 4:
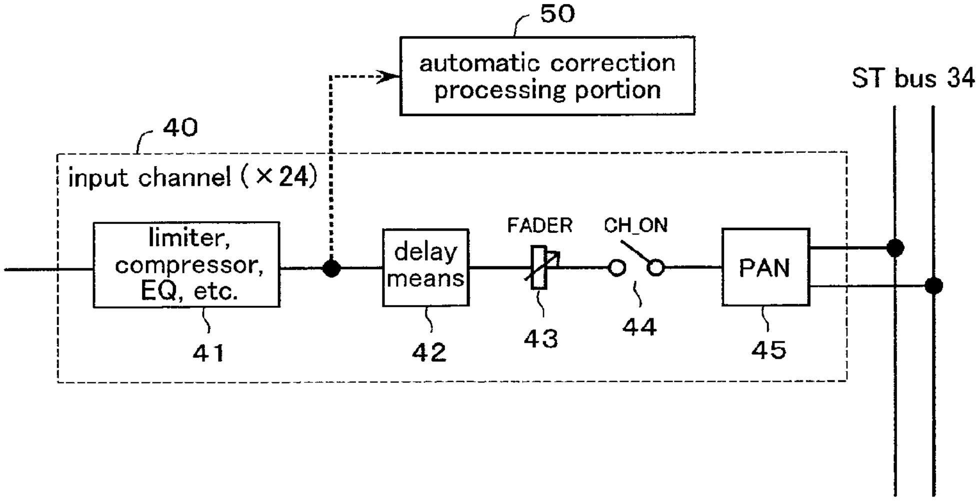
FIG. 4 is a circuit block diagram indicative of a configuration of an input channel of the mixing apparatus of the invention.

Next, a circuit block diagram indicative of an example configuration of an input channel of the input channel portion 33 having 24 channels is shown in FIG. 4.

In an input channel 40, as indicated in FIG. 4, the level and frequency characteristic of an audio signal input from the input patch 32 are controlled by a processing portion 41 having a limiter, a compressor, an EQ and the like, whereas the audio signal is delayed by a certain period of time by a channel delay means 42. The reason why a signal is delayed by the channel delay means 42 is because in a case, for example, where a signal supplied from a single tone generator is collected by a plurality of external microphones, there are time lags among the external microphones due to the differences in the distance between the tone generator and the respective external microphones, causing phase differences between the signals collected by the external microphones. In order to resolve the phase differences between the signals, the time differences are adjusted to make the signals in phase. In order to realize the automatic correction of delay time by the channel delay means 42, automatic correction processing portions 50 (similar to later-described automatic correction processing portions 60, 70, 80) are added to a later-described reference channel and later-described target channels, respectively, whereas a test tone is input from the single tone generator. To each of the automatic correction processing portions 50 added to the reference channel and the target channels, an audio signal (the test tone) transmitted from the processing portion 41 which precedes the channel delay means 42 of the input channel 40 is supplied to detect the time difference in the audio signal (test tone) between the reference channel and the target channel to automatically correct the delay time provided for the channel delay means 42 in accordance with the time difference. The audio signal for which the channel delay means 42 has adjusted the delay time is supplied to a fader 43, so that the audio signal whose tone volume level has been controlled by the fader 43 is supplied to a pan 45 through an input channel switch (CH_ON) 44. Signals whose sound images have been localized by the pan 45 for the stereo L channel and R channel are supplied to stereo buses L and R of the ST bus 34, respectively.

Figure 5:
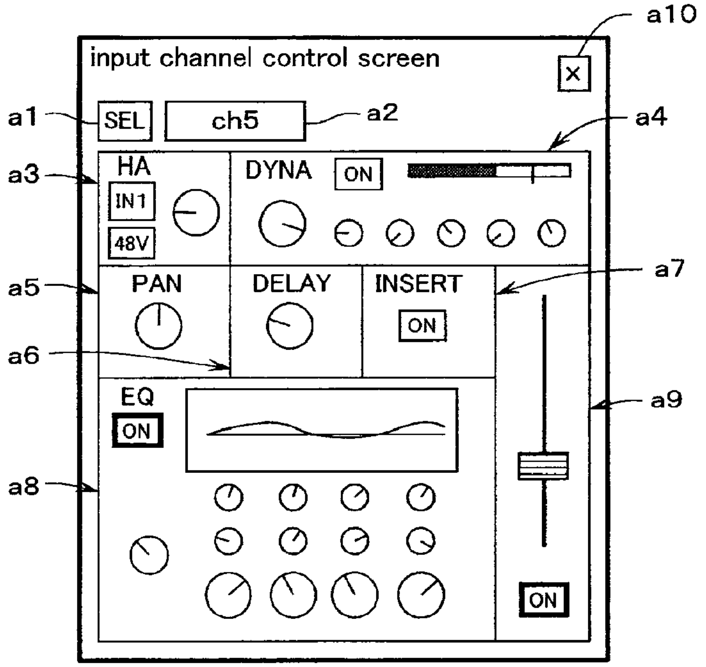
FIG. 5 is an input channel control screen of the mixing apparatus of the invention.

Next, FIG. 5 indicates an example input channel control screen displayed on the display unit 16 when various parameters of an input channel are to be controlled. The input channel control screen is a GUI screen on which a user can manipulate knobs and the like to control the parameters.

On the input channel control screen indicated in FIG. 5, if the SEL key 21*b* of any of the channel strips 21 is manipulated, the selected input channel number is displayed on a display box a2, with the displayed color of a SEL key a1 being turned to an illuminated state. In the shown example, “channel 5” is selected to allow the user to control parameters on “channel 5” in respective fields which will be explained later. On an HA field a3, a patched input port (IN1) and the on/off state of a phantom power (48V) are indicated with a knob for controlling an input level. On a DYNA field a4, a switch for switching between on and off of dynamics of the limiter or the compressor of the processing portion 41, a meter indicative of the value of a parameter, and a plurality of knobs for controlling parameters are provided. On a PAN field a5, a PAN setting knob for specifying the localization of a sound image in the PAN 45 is provided. On a DELAY field a6, a DELAY setting knob for allowing the user to specify the delay time of the channel delay means 42 is provided. On an INSERT field a7, a switch (ON) for switching, between on and off, a signal path which is to be inserted into the input channel is provided. On an EQ field a8, a box for displaying the characteristic of the equalizer, a switch (ON) for switching a 4 band EQ between on and off, and a plurality of knobs for changing Q and frequency parameters of the respective bands are provided. On a FADER field a9, a fader for specifying the input level of the input channel and a switch (ON) for switching the channel between on and off are provided.

By manipulating the SEL key 21*b* of the channel strip 21, as described above, the user is able to select an input channel the parameters of which the user desires to specify on the input channel control screen. On the input channel control screen, furthermore, the user is able to specify various parameters on the selected input channel by manipulating the switches and the knobs displayed on the fields ranging from the HA field a3 to the FADER field a9. In addition, the input channel control screen can be closed by clicking a close button a10.

On the mixing apparatus 1 of the present invention, by the automatic correction of respective delay times of the respective channel delay means 42, phases of audio signals of a plurality of target channels can be coincident with the phase of the audio signal of the reference channel. By user's instructions to execute the automatic correction made by use of the operating element 18 for instructing the automatic correction or made on a screen displayed on the display unit 16, an automatic correction process indicated in a flowchart of FIG. 9 starts.

Figure 6:
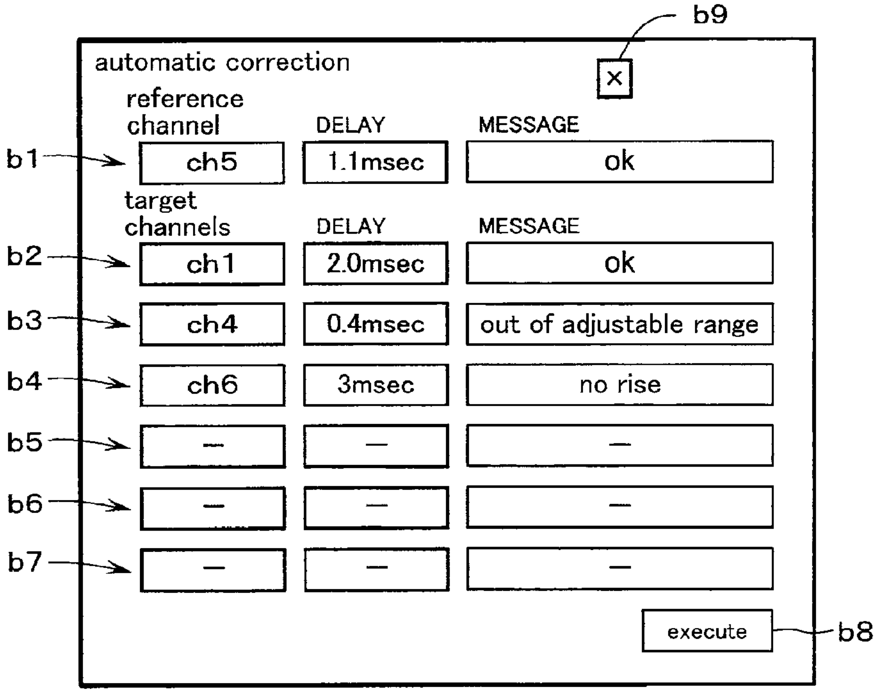
FIG. 6 is an automatic correction screen for automatically correcting delay parameters of the mixing apparatus of the invention.
Figure 9:
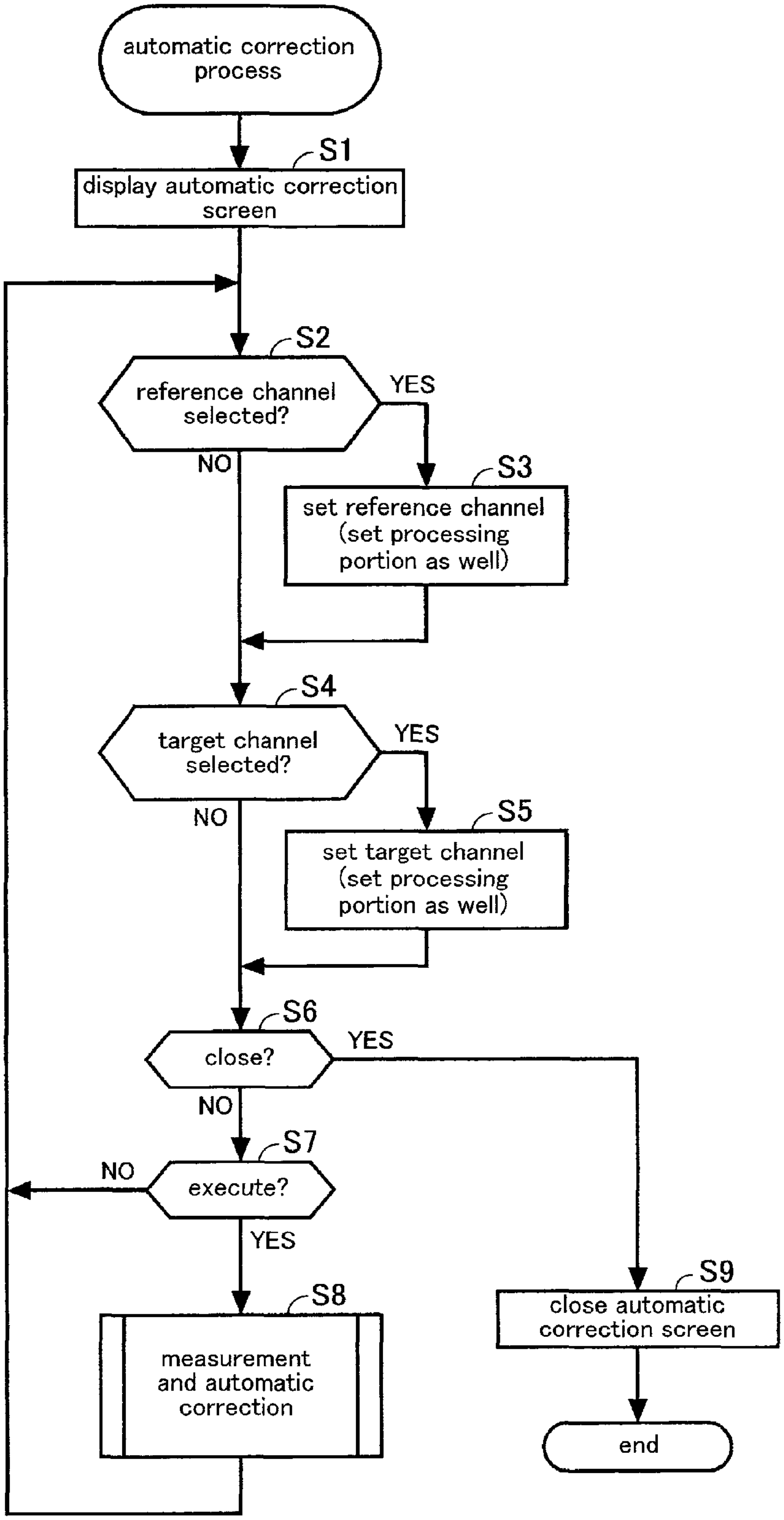
FIG. 9 is a flowchart of an automatic correction process carried out by the mixing apparatus of the invention.

After the start of the automatic correction process shown in FIG. 9, an automatic correction screen is displayed on the display unit 16 in step S1. An example of the automatic correction screen is indicated in FIG. 6. When the user has selected a reference channel in step S2 with the selected channel being set as the reference channel in step S3, the set reference channel is displayed on the left side of a "reference channel" section. In this case, by user's depression of the SEL key 21*b* of the channel strip 21 to which the input channel which the user desires to define as the reference channel is assigned, the input channel is set as the reference channel. In the shown example, "Ch. 5" is defined as the reference channel. The step S3 includes processing for connecting the automatic correction processing portion 50 (similar to the later-described automatic correction processing portions 60, 70, 80) so that the automatic correction processing portion 50 will precede the channel delay means 42 of the selected reference channel "Ch. 5", and processing for detecting the delay time currently set for the channel delay means 42. In the next step S4, the manipulation of selecting a target channel is performed, so that the selected channel is set as a target channel in step S5 to display the set target channel on the left side of the first row of a "target channel" section. In this case, by user's depression of the SEL key 21*b* of the channel strip 21 to which the input channel which the user desires to set as a target channel is assigned while depressing the SEL key 21*b* of the channel strip of the reference channel, the input channel is set as a target channel. In the shown example, "Ch. 1" is set as a target channel. In addition, the step S5 also includes the processing for connecting the automatic correction processing portion 50 to precede the channel delay means 42 of the "Ch. 1" which is the selected target channel, and the processing for detecting the current delay time set for the channel delay means 42.

The selection of a target channel can be repeated until an EXECUTE button b8 is clicked. In the shown example, the step S4 and the step S5 are repeated, so that "Ch. 4" which is the set target channel is displayed on the left side of the second row of the "target channels" section, whereas "Ch. 6" which is the set target channel is displayed on the left side of the third row. The number of channels which can be set as a reference channel is one, whereas the number of channels which can be set as a target channel is plural (six channels in the case of the embodiment). Furthermore, the processing for connecting the automatic correction processing portions 50 to precede the respective channel delay means 42 of the selected target channels "Ch. 4" and "Ch. 6", and the processing for detecting the current delay times set for the channel delay means 42 of the target channels are also performed. On DELAY section placed in the middle of the reference channel section and the target channel section, the delay times set for the respective channel delay means 42 of the channels by a measurement and automatic correction process are displayed in milliseconds (msec). Until the user clicks on the EXECUTE button b8, more specifically, the respective delay times set for the respective channel delay means 42 and detected by the steps S3, S5 are displayed. The resolution of the delay time is preferably at least 0.1 msec. On MESSAGE section provided on the right side of the reference channel section and the target channel section, respective results of the measurement and automatic correction process are displayed. Until the user clicks on the EXECUTE button b8, more specifically, "-" is displayed on the MESSAGE section. On the automatic correction screen shown in FIG. 6, because the "target channel" section has six rows, 6.1 Ch stereo system can be applied. In this case, however, because little effect will be produced on an LFE (low frequency effect channel) by making signals in phase, the control of delay time will not be performed for the LFE channel. In a case where the mixing apparatus 1 is applied to a 6.1 Ch stereo system, seven automatic correction processing portions 50 (similar to the later-described automatic correction processing portions 60, 70, 80) are provided for channels including the reference channel.

If a CLOSE button b9 for closing the screen is clicked before the EXECUTE button b8 is clicked, the click of the CLOSE button b9 is detected in step S6 to proceed to step S9 to close the automatic correction screen on the display unit 16 to terminate the automatic correction process.

When the EXECUTE button b8 is clicked, the click of the EXECUTE button b8 is detected in step S7 to proceed to step S8 to perform the measurement and automatic correction process. In the measurement and automatic correction process, the reference channel set in the step S3 and all the target channels set in the step S5 are selected as input channels which the user desires to control. Then, a single tone generator generates a test tone so that respective external microphones patched to the input channels which are to be controlled can catch the test tone. These external microphones are placed at user's desired locations, respectively, whereas the test tone is propagated through the space between the tone generator and the respective external microphones (through the air existing in the space) before the respective external microphones catch the test tone. More specifically, each external microphone is to catch the test tone which has been delayed in accordance with the distance between the external microphone and the tone generator. Each target channel detects a time difference between the test tone which has not been delayed yet by the channel delay means of the target channel and the test tone which has not been delayed yet by the channel delay means 42 of the reference channel. Because a certain delay time (a delay parameter) is set for the channel delay means 42 of the reference channel, a delay parameter is set for the channel delay means 42 of the target channel in accordance with the detected time difference and the delay parameter set for the reference channel in order to make the test tone of the target channel in phase with the test tone output from the reference channel. More specifically, a new delay parameter indicative of a delay time obtained by adding the detected time difference to a delay time represented by the current delay parameter of the reference channel is set for the target channel.

The above-described measurement and automatic correction process is performed for the respective target channels which are the set "n" channels. In a case where it is judged that the phase of an audio signal which is to be output from a target channel has been automatically corrected to be coincident with the phase of an audio signal which is to be output from the reference channel by the measurement and automatic correction process, a message saying "OK" is displayed on a MESSAGE box of the target channel, with the delay time displayed on the DELAY box being replaced with the automatically corrected delay parameter. In a case where it has been judged that the phase lead of the audio signal which is to be input to the target channel is excessively large compared with the maximum allowable delay time which can be set for the channel delay means 42, or a case where it has been judged that the channel delay means 42 will not be able to make the phase of the audio signal be coincident with the phase of the audio signal of the reference channel because of the delay of the phase of the audio signal which is to be input to the target channel being larger than the delay of the phase of the audio signal which is to be input to the reference channel, a message saying "out of adjustable range" is displayed on the MESSAGE box of the target channel without updating the delay time displayed on the DELAY box. In a case where it has not been detected that the test tone has been input to the target channel within a certain period of time, a massage saying "no rise" is displayed on the MESSAGE box of the target channel without updating the delay time displayed on the DELAY box.

Figure 8:
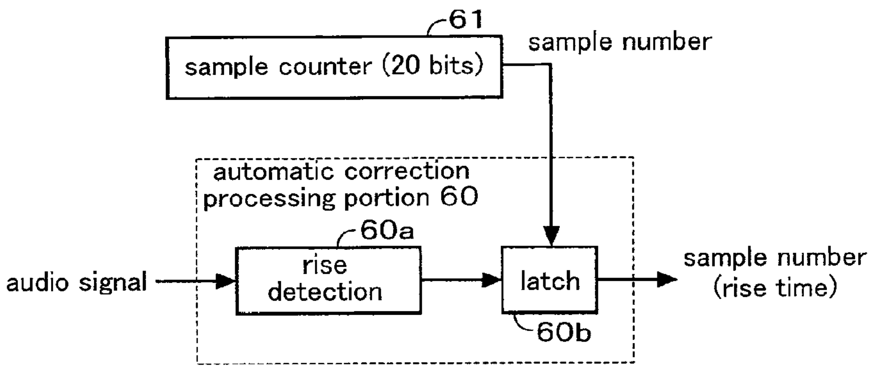
FIG. 8 is a configuration of the first embodiment of an automatic correction processing portion of the mixing apparatus of the invention.
Figure 10:
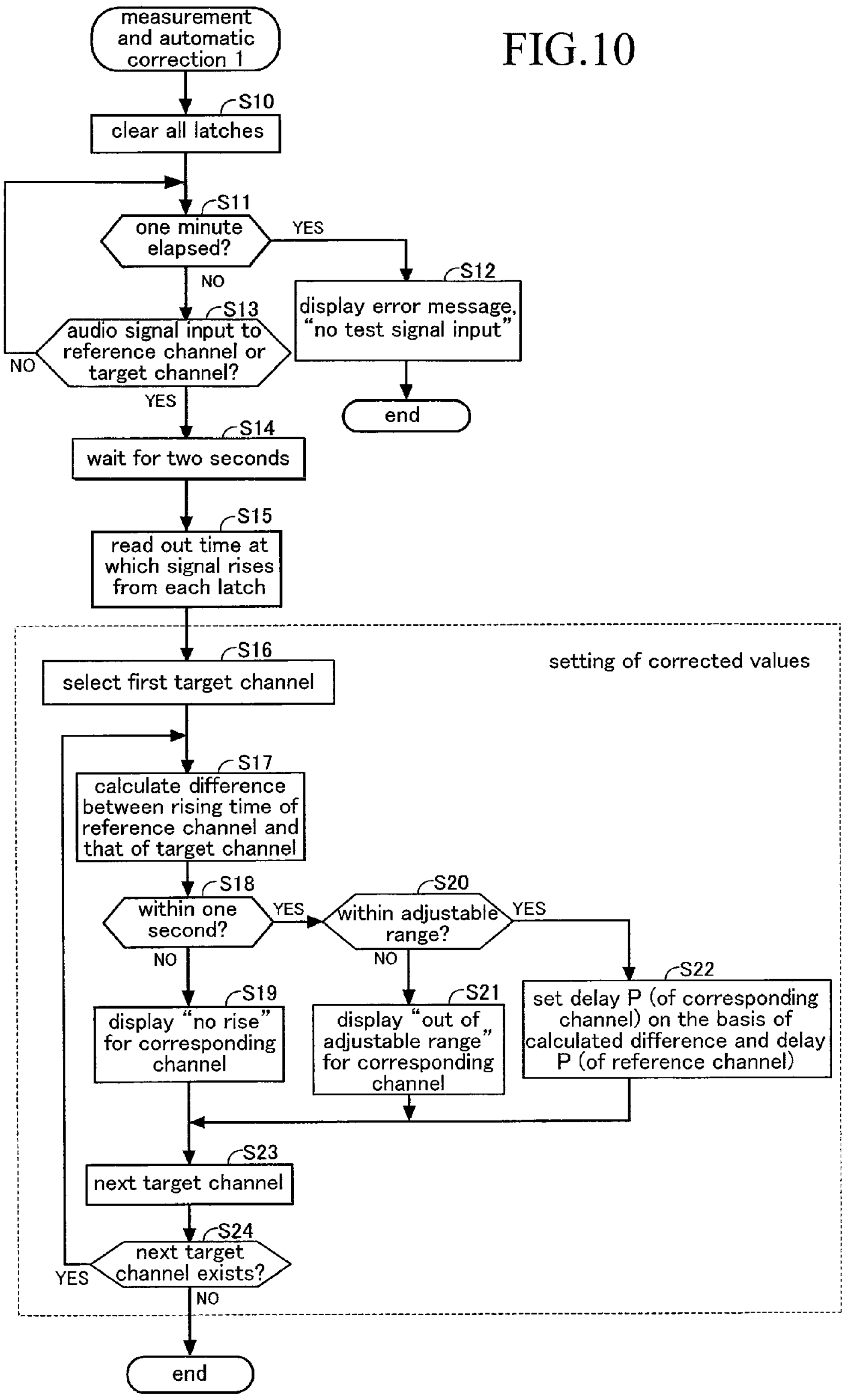
FIG. 10 is a flowchart of a measurement and automatic correction process which is the first embodiment of the automatic correction process carried out by the mixing apparatus of the invention.

The measurement and automatic correction process performed in step S8 has been described above. Hereafter, the first to third embodiments which embody the measurement and automatic correction process will be explained. A flowchart of a measurement and automatic correction process 1 of the first embodiment is indicated in FIG. 10, while a configuration of the automatic correction processing portion 60 of a channel corresponding to the first embodiment is indicated in FIG. 8. The automatic correction processing portions 60 are connected to precede the channel delay means 42 of the reference channel selected in the step S3 of the automatic correction process indicated in FIG. 9, and the respective channel delay means 42 of the target channels selected in the step S5. The processing of the automatic correction processing portions 60 is done by the signal processing portion (DSP) 15.

After the start of the measurement and automatic correction process 1 of the first embodiment, all the latches 60*b* of the automatic correction processing portions 60 connected to precede the respective channel delay means 42 of the reference channel and the target channels of "n" channels are cleared in step S10. In step S11 and step S13, the CPU 10 waits for one minute. During this standby time, a test tone which decays but rises clearly is generated by a tone generator so that the external microphones patched to the reference channel and the target channels can catch the test tone. It is preferable that the tone generator is a percussion instrument such as a drum, for example. In a case where it is judged in step S13 that an audio signal (the test tone) has been input to the reference channel or any one of the target channels before a minute has passed, that is, it is judged that a rise in an audio signal has been detected in the reference channel or any of the target channels, the CPU 10 carries out step S14. In a case where it is judged in step S13 that any audio signals (test tones) have not been input to the reference channel or any of the target channels until after a lapse of one minute, the CPU 10 branches from step S11 to step S12 to display a pop-up error message saying "no test signal input" on the display unit 16 to terminate the measurement and automatic correction process 1.

In step S14, the CPU 10 waits for two seconds in order to detect a rise of the input test tone in each of the reference channel and the target channels of n channels. In step S15, the CPU 10 reads out respective time at which the respective audio signals (test tone) input to the reference channel and the target channels rise from the respective latches 60*b* of the reference channel and the target channels. To the latch 60*b*, rising timing detected by a rise detection portion 60*a* is applied as a latch signal, so that the latch 60*b* latches a sample number which is a value counted by a sample counter 61 at the time of the application of the latch signal. The rise detection portion 60*a* detects the timing at which the audio signal (test tone) input to the channel exceeds a certain threshold value or the timing of a rising peak as rising timing only once. The sample counter 61, which is a 20-bit counter, increments a counter by 1 at each sampling period. In step S15, more specifically, the CPU 10 reads out the sample number which is a counted value of a sample clock as the time at which the audio signal rises. In a case of a sample clock of 96 kHz, the resolution of the counter is about 0.01 msec. In a case of a sample clock of 48 kHz, the resolution is about 0.02 msec.

In step S16, the first target channel is selected. In step S17, the difference between the sample number corresponding to the rising time of the first target channel and the sample number corresponding to the rising time of the reference channel is calculated. The sample numbers latched to the reference channel and the target channel vary by the amount of time which corresponds to the distance between the tone generator which generates the test tone and the respective external microphones patched to the channels. More specifically, the difference between the sample number latched to the reference channel and the sample number latched to the target channel is equivalent to the difference in phase of the test tone between the reference channel and the target channel. By multiplying the difference between the sample numbers by the cycle of the sample clock, therefore, the time difference between the audio signal (test tone) input to the reference channel and the audio signal (test tone) input to the target channel can be obtained.

Because the sample counter 61 repeatedly counts from "0" to a certain maximum value ($2^{20}-1$) without consideration of input of audio signals, there can be cases where the two sample numbers (counted values) corresponding to the rising time of the reference channel and the rising time of the target channel interpose the maximum value. However, because the 20 bits of the sample counter 61 is quite great, the maximum value is quite great compared to the difference between the sample numbers (counted values) corresponding to the respective rising times of the reference channel and the target channel. In a case where the absolute value of the above-calculated difference is quite great, therefore, it can be considered that the two sample numbers (counted values) corresponding to the respective rising times of the reference channel and the target channel interpose the maximum value. In such a case, therefore, the maximum value is added to the smaller one of the sample numbers before the difference is calculated. Furthermore, because the audio signal input to the reference channel is regarded as the reference, the obtained time difference will be a positive value if the input of the audio signal to the target channel is behind the input of the audio signal to the reference channel. If the input of the audio signal to the target channel is ahead of the input of the audio signal to the reference channel, the time difference will be a negative value.

In step S18, it is judged whether the obtained time difference is within one second or not. If the time difference (i.e., the absolute value of the time difference) exceeds one second, it is considered that the distance between the external microphone patched to the reference channel and the external microphone patched to the target channel exceeds approximately 340 m which is equivalent to the distance for which a tone is transferred in one second. As a result, it cannot be considered that the two external microphones collect a test tone emitted from the same tone generator. In a case where the time difference exceeds one second, therefore, the CPU 10 will not perform the automatic correction, but displays in step S19, a message saying "no rise" on the message box (on the automatic correction screen) of the target channel selected in step S16.

In a case where the time difference is within one second, it is judged in step 20 on the basis of the delay time which can be set for the channel delay means 42 of the target channel and the delay time currently set for the channel delay means 42 of the reference channel whether the time difference obtained in step S17 is within an adjustable range or not. In a case where it is judged that the time difference is beyond the range, the CPU 10 will not perform the automatic correction, but displays in step S21 a message saying "out of adjustable range" on the MESSAGE box of the target channel selected in step S16. In a case where it is judged that the time difference is within the adjustable range, a delay time (delay P) is set for the channel delay means 42 of the target channel selected in step S16 on the basis of the obtained time difference and the delay time (delay P) set for the channel delay means 42 of the reference channel, with the delay time displayed on the DELAY box of the target channel being replaced with the set delay time. The range within which the time difference is adjustable indicates that if the time difference of the target channel with respect to the reference channel is a positive value, the sum of the time difference and the delay time set for the reference channel is smaller than or equal to the maximum value of the delay time which can be set for the delay means 42 of the target channel. In addition, the adjustable range indicates that if the time difference of the target channel with respect to the reference channel is a negative value, the sum of the time difference and the delay time set for the reference channel is "0" or more. In order to allow such a setting of the delay time of the target channel, it is necessary that the delay time set for the reference channel should be a positive value which is large to some extent.

After step S19, step S21 or step S22, the second target channel which is the next target channel is selected in step S23 to repeat the above-described steps S17 to S22 to perform the automatic correction process for the channel delay means 42 of the second target channel. For the respective channel delay means 42 of the third and later target channels as well, furthermore, the above-described steps S17 to S22 are repeatedly performed. When the automatic correction process is performed for all the target channels, the measurement and automatic correction process 1 terminates.

As described above, the measurement and automatic correction process starts by user's click on the EXECUTE button b8 to carry out the process for setting corrected values formed of steps S16 to S24. More specifically, the process formed of steps S17 to S22 is repeated to perform the process for automatically correcting respective delay times set for the respective channel delay means 42 of the target channels. Furthermore, the DELAY boxes and the MESSAGE boxes displayed on the automatic correction screen shown in FIG. 6 are updated in accordance with the results of the automatic correction process. In the measurement and automatic correction process 1 of the first embodiment, a test tone emitted from a single tone generator is to be collected by the respective external microphones to be input to the reference channel and the target channels to detect respective rise times of the audio signals (test tone) in accordance with the sample numbers which are the values counted by the sample counter 61 to obtain respective time differences in the test tone between the reference channel and the respective target channels in accordance with the differences in the sample number. In accordance with the obtained time difference, the automatic correction process for correcting the delay time set for the channel delay means 42 of the target channels is performed for each target channel.

Figure 11:
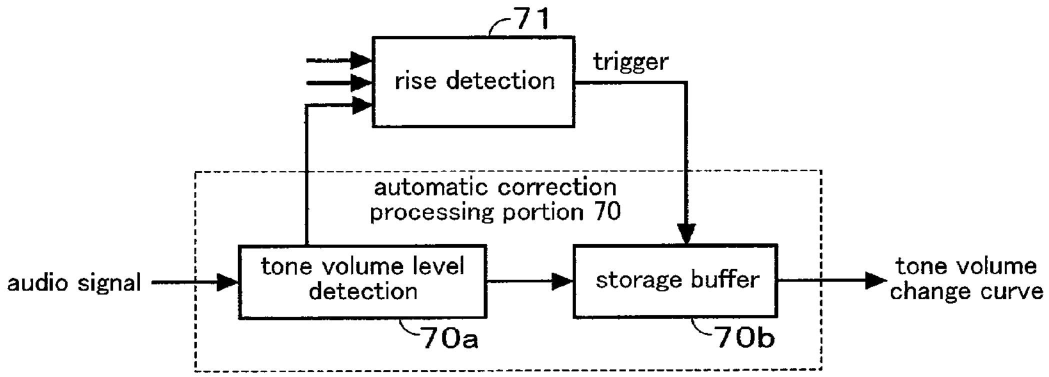
FIG. 11 is a configuration of the second embodiment of the automatic correction processing portion of the mixing apparatus of the invention.
Figure 13:
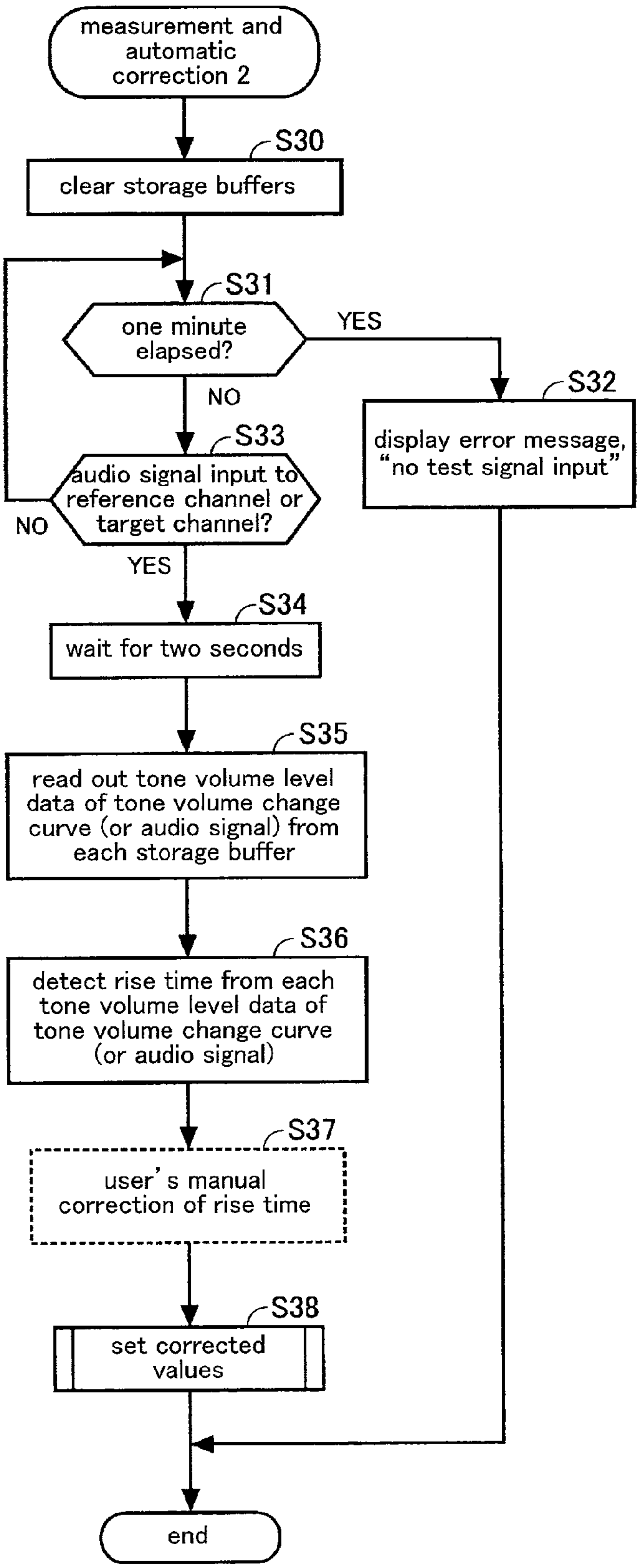
FIG. 13 is a flowchart of a measurement and automatic correction process 2 which is the second embodiment of the automatic correction process carried out by the mixing apparatus of the invention.

A flowchart of a measurement and automatic correction process 2 of the second embodiment of the measurement and automatic correction process is indicated in FIG. 13, while a configuration of an automatic correction processing portion 70 of a channel corresponding to the second embodiment is indicated in FIG. 11. The automatic correction processing portions 70 are connected to precede the channel delay means 42 of the reference channel selected in the step S3 of the automatic correction process indicated in FIG. 9, and the respective channel delay means 42 of the respective target channels selected in the step S5. The processing of the automatic correction processing portions 70 is done by the signal processing portion (DSP) 15 and the CPU 10.

After the start of the measurement and automatic correction process 2 of the second embodiment, all the storage buffers 70*b* of the automatic correction processing portions 70 connected to precede the respective channel delay means 42 of the reference channel and the target channels of "n" channels are cleared in step S30. In step S31 and step S33, the CPU 10 waits for one minute. During this standby time, a test tone which decays but rises clearly is generated by a tone generator so that the external microphones patched to the reference channel and the target channels can catch the test tone. In a case where it is judged in step S33 that an audio signal (the test tone) has been input to the reference channel or any one of the target channels before a minute has passed, that is, it is judged that a rise in an audio signal has been detected in the reference channel or any of the target channels, the CPU 10 carries out step S34. In a case where it is judged in step S33 that any audio signals (test tones) have not been input to the reference channel or any of the target channels until after a lapse of one minute, the CPU 10 branches from step S31 to step S32 to display a pop-up error message saying "no test signal input" on the display unit 16 to terminate the measurement and automatic correction process 2.

In step S34, the CPU 10 waits for two seconds in order to detect a rise in each of the reference channel and the target channels of n channels. In step S35, the CPU 10 reads out, from each of the storage buffers 70*b* of the reference channel and the target channels, tone volume level data of a tone volume change curve (or an audio signal) of an audio signal (test tone) input to the channel. Now, the above-described "tone volume change curve (or audio signal)" will be explained. The tone volume change curve is the data obtained by detecting the envelope of the input audio signal and sampling the waveform of the detected envelope at certain sampling timing by a tone volume level detection means 70*a*. In this case, therefore, the respective tone volume level detection means 70*a* of the respective automatic correction processing portions 70 of the reference channel and the target channels have the function of detecting an envelope and the function of sampling. In addition, the audio signal is the data obtained by sampling an input audio signal at certain sampling timing. In this case, therefore, the respective tone volume level detection means 70*a* of the automatic correction processing portions 70 of the reference channel and the target channels have the sampling function of changing the timing at which input digital audio signals are sampled. However, the sampling rate of the tone volume level detection means 70*a* may be the same as that of the input digital audio signal. In this case, it is not necessary to change the sampling timing. The tone volume level data of the tone volume change curve is sampled values of the envelope, whereas the tone volume level data of the audio signal is sampled values of the audio signal. The tone volume level data of this case is compressed and represented by "dB". Both the tone volume change curve and the audio signal are used in processes which will be described later. In the later descriptions, therefore, the above-described term "tone volume change curve (or audio signal)" will be used.

Each of the storage buffers 70*b* provided in the respective automatic correction processing portions 70 of the reference channel and the target channels has a ring buffer so that tone volume level data on the audio signal (the test tone) detected by the tone volume level detection means 70*a* and input to the channel is repeatedly written into the ring buffer as soon as the storage buffer 70*b* has been cleared in step S30. When the rising timing detected by a rise detection portion 71 is applied to the storage buffer 70*b* as a trigger signal, the CPU 10 writes the tone volume level data for about two seconds into the ring buffer, and then stops the writing. The ring buffer has the capacity for storing tone volume level data for a period of time which is slightly more than two seconds. As for the tone volume level data stored in the respective storage buffers 70*b* of the reference channel and the target channels, a sampled value which is about 100 samples earlier than a point in time at which the above-described trigger signal has been input, that is, which is earlier than the point in time by a certain short period of time is regarded as the tone volume level data of time "0", whereas sampled values for the following about two seconds are regarded as tone volume level data which varies with time values which have passed since the above-described time "0".

The rise detection portion 71, which is shared by the respective automatic correction processing portions 70 of the reference channel and the target channels, defines the timing at which respective audio signals (test tone) input to the reference channel and the target channels exceed a certain threshold value or the timing of a rising peak as the rising timing, and applies the earliest timing as a trigger signal to the storage buffers 70*b*. In the respective ring buffers of the respective storage buffers 70*b* of the reference channel and the target channels, as a result, with the timing which is about 100 samples earlier than the timing of the earliest input of an audio signal to the reference channel or any of the target channels being defined as time "0", sampled values which follow the time "0" are stored concurrently in parallel at each timing corresponding to a certain sampling rate. In this case, furthermore, because the timing which is about 100 samples earlier than the timing of the earliest input of an audio signal is defined as time "0", the respective ring buffers are to store the tone volume level data including respective rising of the audio signals of the reference channel and the target channels.

In step S35, more specifically, from each of the storage buffers 70*b* of the reference channel and the target channels, tone volume level data of the audio signal (test tone) which has been input to the corresponding channel and ranges for about two seconds is read out from a storage position which is slightly ahead (about 100 samples ahead) of the rising timing of the audio signal (test tone) which has been collected by the external microphone and has the shortest delay time. As a result, the tone volume level data ranging from the point which is earlier than the rise can be read out. Furthermore, because tone volume level data is stored in dB and is compressed in the storage buffers 70*b*, the storage capacity of the storage buffers 70*b* can be reduced.

In step S36, the rise time is detected from the tone volume level data of the tone volume change curve (or audio signal) read out from each storage buffer 70*b* in each channel. In this case, more specifically, the timing at which the tone volume change curve (or audio signal) exceeds the certain threshold value or the timing of a rising peak is detected as the rise time.

In step S37, a user's manual correction to the rise time is made, while corrected values are set in step S38. Because the manual correction of step S37 may not be necessarily made, a case in which the step S36 is directly followed by the step S38 for setting corrected values without the manual correction of step S37 will be explained.

The detailed explanation of the setting of corrected values in step S38 will be omitted, for the step S38 is similar to the steps S16 to S24 for setting corrected values in the measurement and automatic correction process 1 of the first embodiment. In the step S38 for setting corrected values, on the basis of the time differences between the rise time of the reference channel and the respective rise times of the target channels detected in the step S36, the respective delay times which are to be set for the respective channel delay means 42 of the target channels are automatically corrected. Then, the DELAY box and the MESSAGE box of the automatic correction screen shown in FIG. 6 are updated in accordance with the result of the automatic correction.

In the measurement and automatic correction process 2 of the second embodiment, as described above, a test tone emitted from the single tone generator is input to the reference channel and the target channels to relatively detect the respective rise times of the respective input audio signals (test tone) on the basis of the tone volume level data of the respective tone volume change curves (or audio signals) of these audio signals (test tone) to perform the automatic correction made to the respective delay times which are to be set for the respective channel delay means 42 of the target channels in accordance with the time differences in the rise time.

Figure 7:
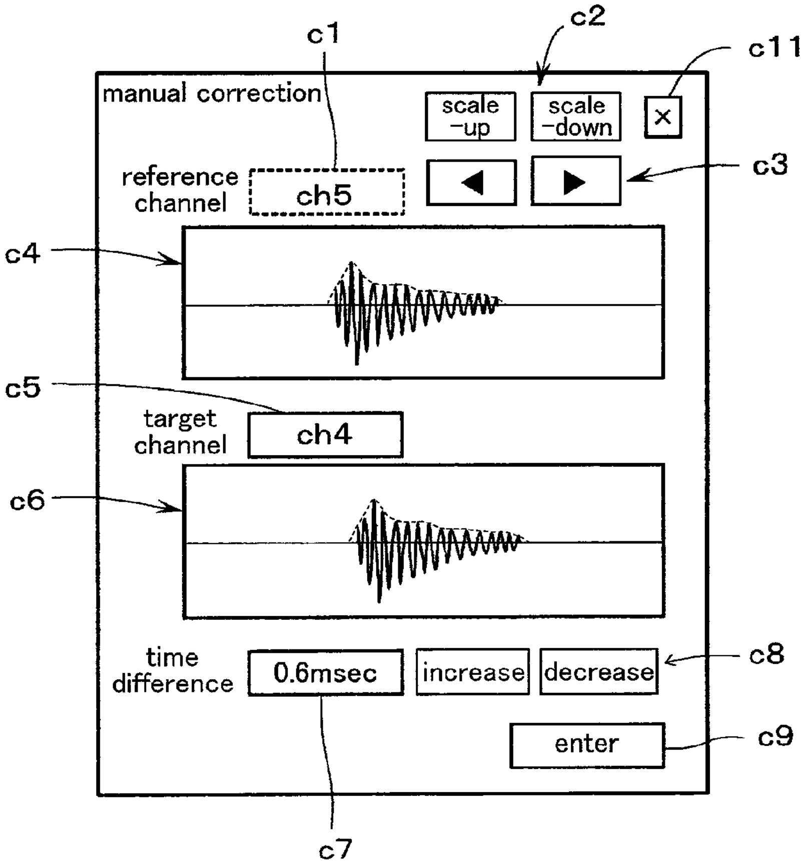
FIG. 7 is a manual correction screen for manually correcting delay parameters of the mixing apparatus of the invention.

Next, a case in which the step S37 for manually correcting the time will be performed will be explained. The process for correcting the time is a process for allowing a user to correct, through user's vision, the time difference calculated by program processing between an audio signal input to the reference channel and an audio signal input to the target channel. FIG. 7 indicates a screen on which the user makes a manual correction of this case. Hereafter, the manual correction screen of FIG. 7 will be explained. The input channel number ("Ch. 5") set as the reference channel in the steps S2, S3 of the automatic correction process is displayed on a display box c1, whereas the tone volume change curve (or audio signal) of the test tone read out from the storage buffer 70*b* of the reference channel and delayed by the channel delay means 42 of the reference channel is displayed on a time axis on a signal display portion c4. In addition, the input channel number ("Ch. 4") selected from the target channels set in the steps S4, S5 of the automatic correction process is displayed on a display box c5, whereas the tone volume change curve (or audio signal) of the test tone read out from the storage buffer 70*b* of the target channel and delayed by the channel delay means 42 of the target channel is displayed on the time axis on a signal display portion c6. In this figure, the respective tone volume change curves, more specifically, envelopes are indicated by broken lines, whereas the respective audio signals are indicated by solid lines.

By clicking on either of scale-up/scale-down keys c2, both of the waveforms representative of the tone volume change curves (or audio signals) displayed on the signal display portions c4, c6 are scaled up or down. By clicking on either of scroll keys c3, both of the tone volume change curves (or audio signals) displayed on the signal display portions c4, c6 are scrolled to the right or left.

The tone volume change curves (or audio signals) of the reference channel and the target channel displayed on the signal display portions c4, c6 are the waveforms representative of the tone volume change curves (or audio signals) which are to be output from the reference channel and the target channel, respectively, whereas the time difference between the waveform of the tone volume change curve (or audio signal) output from the reference channel and the waveform of the tone volume change curve output from the target channel is indicated as "0.6 msec" on a display box c7. This time difference is figured out by use of the respective rise times of the audio signals of the reference channel and the target channel. More specifically, the respective rise times have been detected from the tone volume level data of the respective tone volume change curves (audio signals) in the above-described step S36. Because there can be cases where the calculated time difference has an error due to inaccurately detected rising timing, it is preferable to allow the user to make the manual correction through the vision by displaying the tone volume change curves (or audio signals). Hereinafter, the manual correction will be explained.

Through user's vision, the user controls the time difference so that the tone volume change curve (or audio signal) of the reference channel and the tone volume change curve (or audio signal) of the target channel will be timed to coincide with each other. The user's control of the time difference is done by clicking on increase/decrease keys c8. In the shown example, the tone volume change curve (or audio signal) of the target channel is 0.6+α msec later than the tone volume change curve (or audio signal) of the reference channel. The "α" is a value obtained by subtracting the calculated time difference (0.6 msec, in this case) from a time difference corresponding to the difference between the distance between the tone generator which has emitted the test tone and the external microphone patched (connected) to the reference channel and the distance between the tone generator and the external microphone patched to the target channel. On the signal display portions c4, c6 shown in FIG. 7, the respective tone volume change curves (or audio signals) of the reference channel and the target channel are placed to be displaced with each other by the time difference "α" on the time axis. In response to the click on the increase/decrease key c8, the above-calculated time difference increases or decreases to move the waveform of the tone volume change curve (or audio signal) of the target channel displayed on the signal display portion c6 on the time axis in accordance with the increased/decreased amount of time. In accordance with the amount of move, furthermore, the time difference displayed on the display box c7 is calculated and updated. By user's click on the increase/decrease key c8 to coincide, on the time axis, the tone volume change curve (or audio signal) of the target channel displayed on the display section c6 with the tone volume change curve (or audio signal) of the reference channel displayed on the display section c4, the time difference between the audio signal output from the reference channel and the audio signal output from the target channel is corrected so that the time difference will be almost eliminated.

By a click on an "enter" button c9 after the manual correction, the updated time difference displayed on the display box c7 is added to the rise time of the reference channel detected in the step S36 to newly calculate a rise time of the tone volume level data of the tone volume change curve (or audio signal) of the target channel. By this new calculation, the rise time of the tone volume level data of the tone volume change curve (or audio signal) of the target channel detected in the step S36 is corrected. After the correction to the rise time of the target channel made by the click on the "enter" button c9, corrections to the respective rise times of the remaining target channels are made one after another. When the corrections to the respective rise times of all the target channels have been completed, the user clicks on a CLOSE button c11. In response to the click on the CLOSE button c11, the manual correction screen is closed to terminate the process for correcting rise times in step S37.

After the process for correcting rise times in step S37, the above-described process for setting corrected values in step S38 is performed. In accordance with the respective time differences between the rise time of the reference channel detected in the step S36 and the target channels' rise times corrected in the step S37, in this case, the respective delay times which are to be set for the respective channel delay means 42 of the respective target channels are automatically corrected. Similarly to the above-described case, the DELAY section and the MESSAGE section displayed on the automatic correction screen shown in FIG. 6 are updated in accordance with the results of the automatic correction process.

The above-described steps S37 and S38 may be done as follows.

On the manual screen of FIG. 7 opened in step S37, when the tone volume change curve (or audio signal) of the target channel displayed on the display portion c6 is made coincide with, on the time axis, the tone volume change curve (or audio signal) of the reference channel displayed on the display portion c4, the time difference between the reference channel and the target channel is calculated. Therefore, the CPU 10 skips the process (step S17 of FIG. 10) of figuring out the difference in step S38 which follows the step S37 but uses the above-calculated time difference to perform the remaining processes of step S38. By manipulating the increase/decrease keys c8, furthermore, the user is able to fine-tune the automatically set time difference. In this case, the user is allowed to adjust the time difference calculated by the automatic correction as the user desires.

In the second embodiment, by use of the respective rise times of the audio signal of the reference channel and the audio signal of the target channel, the difference between the rise times of the two audio signals is calculated before the difference between the rise time of the audio signal of the reference channel and the rise time of the audio signal of the target channel is corrected by manual manipulation. In a case, however, where the difference in the rise time between the two audio signals is small, where the time axis of the signal display portions c4, c6 is long, or the like, the calculation of the difference in rise time between the two audio signals done before the manual correction to the time difference may be omitted so that the manual correction to time difference will be directly made. More specifically, the tone volume change curve (or audio signal) of the reference channel and the tone volume change curve (or audio signal) of the target channel are displayed on the signal display portions c4, c6 without consideration of the difference in rise time between the audio signals by the calculation. The difference in rise time between the audio signals of the reference channel and the target channel may be obtained by moving, on the time axis, the tone volume change curve (or audio signal) of the reference channel or the tone volume change curve (or audio signal) of the target channel displayed on the signal display portions c4, c6 by user's manual manipulation to coincide the rising timing of the audio signals with each other. As for moving the tone volume change curve (or audio signal) on the time axis by manual manipulation, the tone volume change curve (or audio signal) of the reference channel may be moved. Alternatively, the tone volume change curve (or audio signal) of the target channel may be moved.

Figure 12:
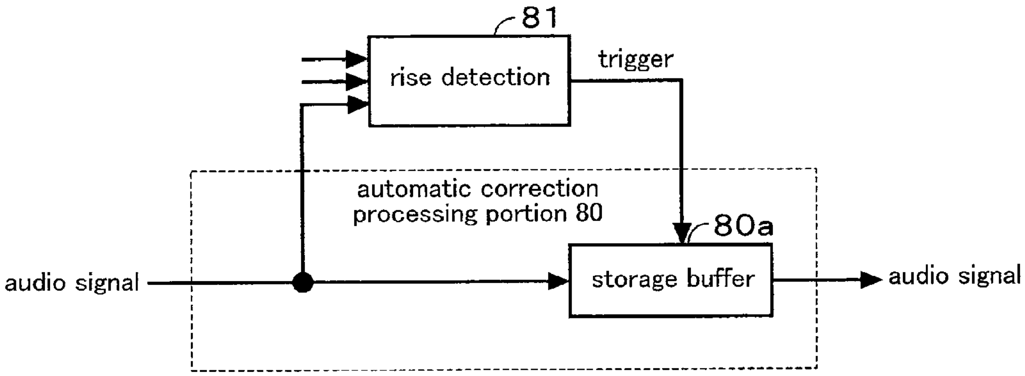
FIG. 12 is a configuration of the third embodiment of the automatic correction processing portion of the mixing apparatus of the invention.
Figure 14:
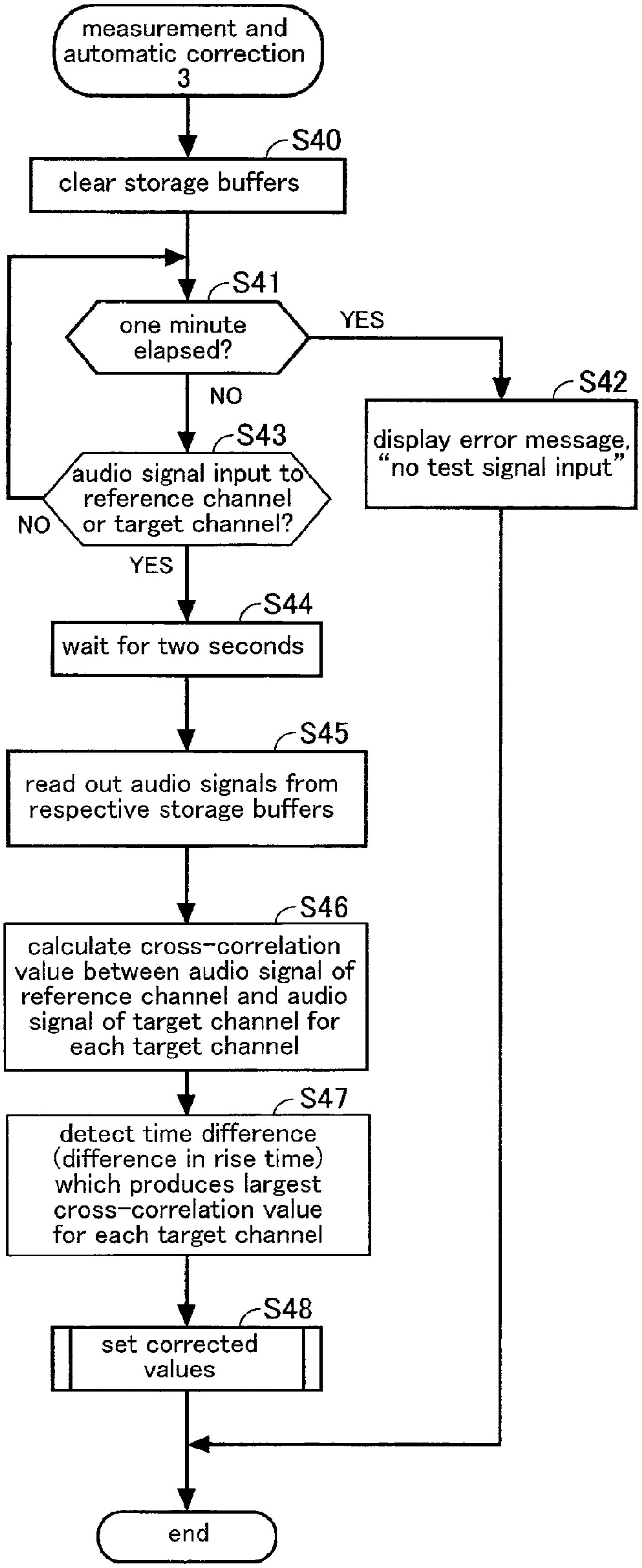
FIG. 14 is a flowchart of a measurement and automatic correction process 3 which is the third embodiment of the automatic correction process carried out by the mixing apparatus of the invention.

A flowchart of a measurement and automatic correction process 3 of the third embodiment which is the measurement and automatic correction process executed in the step S8 of the automatic correction process in response to a click on the EXECUTE button b8 is indicated in FIG. 14, while a configuration of an automatic correction processing portion 80 of a channel corresponding to the third embodiment is indicated in FIG. 12. The automatic correction processing portions 80 are connected to precede the channel delay means 42 of the reference channel selected in the step S3 of the automatic correction process indicated in FIG. 9, and the respective channel delay means 42 of the respective target channels selected in the step S4. The processing of the automatic correction processing portions 80 is done by the signal processing portion (DSP) 15 and the CPU 10.

After the start of the measurement and automatic correction process 3 of the third embodiment, steps S40 to S44 are carried out. However, because the steps S40 to S44 are similar to the steps S30 to S34 of the measurement and automatic correction process 2 of the second embodiment, the explanation of the steps S40 to S44 will be omitted. In the measurement and automatic correction process 3 of the third embodiment, however, a test tone which will be generated from a single tone generator does not necessarily has a clear rise, and is not necessarily a decaying tone.

In step S44, the CPU 10 waits for two seconds in order to detect a rise of an input audio signal (test tone) in each of the reference channel and the target channels of n channels. In step S45, the CPU 10 reads out, from each of storage buffers 80*a* of the reference channel and the target channels, the waveform of an audio signal (test tone) input to the channel.

Each of the storage buffers 80*a* has a ring buffer so that the waveform data representative of an audio signal (a test tone) input to the channel is written into the ring buffer as soon as the storage buffer 80*a* has been cleared in step S40. When the rising timing detected by a rise detection portion 81 which is similar to the rise detection portion 71 of the second embodiment is applied as a trigger signal, the CPU 10 writes waveform data for about two seconds into the ring buffer, and then stops the writing. As for the waveform data of the audio signals stored in the respective storage buffers 80*a* of the reference channel and the target channels as well, similarly to the second embodiment, a sampled value which is about 100 samples earlier than the point in time at which the above-described trigger signal has been input is regarded as the waveform data of time "0", whereas waveform data for the following about two seconds is regarded as waveform data which varies with time values which have passed since the above-described time "0". In this case as well, the sampling rate of the data on the waveform stored in the ring buffer of the storage buffer 80*a* may be either identical to or different from the sampling rate of the input digital audio signal.

The rise detection portion 81, which is shared by the respective automatic correction processing portions 80 of the reference channel and the target channels, defines the timing at which respective audio signals (test tone) input to the reference channel and the target channels exceed a certain threshold value, or the timing of a rising peak as the rising timing and applies the earliest timing as a trigger signal to the storage buffers 80*a*. In step S45, as a result, from each of the storage buffers 80*a* of the reference channel and the target channels, waveform data of the audio signal (test tone) which has been input to the corresponding channel and ranges for about two seconds is read out from a storage position which is slightly ahead (about 100 samples ahead) of the rising timing of the audio signal (test tone) which has been collected by an external microphone and has the shortest delay time.

As for respective audio signals of the target channels read out in step S45, a cross-correlation value for judging the degree of agreement between the audio signal (test tone) of the reference channel and the audio signal (test tone) of a target channel is calculated for each target channel in step S46. The cross-correlation value is calculated by convolution operation performed by the CPU 10. More specifically, the convolution operation is performed by delaying waveform data on the audio signal of a target channel stored in the storage buffer 80*a* with respect to the waveform data on the audio signal of the reference channel stored in the storage buffer 80*a* by certain short periods of time including positive and negative values to multiply respective sample values of the waveform data of the target channel by respective sample values of the waveform data of the reference channel to combine the multiplied results. The negative delay indicates that the waveform data of the audio signal of the target channel is ahead of the waveform data of the audio signal of the reference channel. The delay time obtaining the largest combined value (that is, the cross-correlation value) is regarded as the time difference between the waveform data of the reference channel and the waveform data of the target channel. In other words, the cross-correlation values are calculated by variously delaying the waveform data of the audio signal of the reference channel with respect to the waveform of the audio signal of the target channel. Of the calculated cross-correlation values, the delay time which produces the largest cross-correlation value is the delay time of the target channel with respect to the reference channel.

For each target channel, in step S47, a time difference which produces the largest cross-correlation value for a target channel is detected as the "difference in rise time" between the audio signal (test tone) input to the reference channel and the audio signal (test tone) input to the corresponding target channel. In this case, the respective times of the waveform data read out from the respective storage buffers 80*a* of the reference channel and the target channel vary depending on the distance between the tone generator which has emitted the test tone and the external microphone patched to the channel. More specifically, the time difference between the respective waveform data read out from the respective storage buffers 80*a* of the reference channel and the target channel is equivalent to the difference between the phase of the test tone input to the reference channel and the phase of the test tone input to the target channel.

In the next step S48, a process for setting corrected values is performed in accordance with the above-obtained "differences in rise time". Because the respective time differences between the reference channel and the respective target channels are detected as the "differences in rise time", the CPU 10 skips the process for calculating differences (step S17 of FIG. 10) in step S48 which follows step S47 as explained in the case of the second embodiment, but performs the remaining process in step S48 with the above-obtained time differences being used as the differences. In this process for setting corrected values, more specifically, the process for automatically correcting the delay time set for the channel delay means 42 of each target channel is performed in accordance with the above-described "differences in rise time". As described above, furthermore, the content displayed on the DELAY box and the MESSAGE box of the automatic correction screen shown in FIG. 6 is updated in accordance with the results of the automatic correction process.

By the measurement and automatic correction process 3 of the third embodiment, as described above, a test tone emitted by the single tone generator is input to the reference channel and the target channels to calculate, for each target channel, the cross-correlation between the audio signal input to the reference channel and the audio signal input to the target channel to detect the difference in rise time between the input test tones to perform the process for automatically correcting the delay time which is to be set for the channel delay means 42 of the target channel in accordance with the detected difference in rise time.

In the third embodiment, the waveform data of the audio signal of the target channel is delayed by certain small periods of time including both positive and negative values to calculate cross-correlation values between the audio signals of the reference channel and the target channel. However, the third embodiment may be modified such that the waveform data of the audio signal of the reference channel is delayed by certain small periods of time including both positive and negative values to calculate cross-correlation values between the audio signals of the reference channel and the target channel. Similarly to the above-described case, furthermore, on the basis of the delay time which produces a cross-correlation value of the best agreement, the difference in rise time between the audio signal of the reference channel and the audio signal of the target channel may be calculated.

Furthermore, the present invention is not limited to the above-described embodiments but can be variously modified without departing from the object of the present invention.

Although the mixing apparatus according to the above-described embodiments of the present invention is designed such that respective delay parameters set by the automatic correction process for the respective channels (the reference channel and the target channels) can be individually changed later by the user, the mixing apparatus of the present invention may be modified to link the delay parameters among the channels so that by a change made by the user to the value of the delay parameter of one of the channels, the delay parameters of the other channels will also be changed in order to keep the respective differences between the channels.

In a case where the tone generator is not a spot but ranges over a certain area, it is preferable that a single tone generator is placed at a location which generates the largest tone in the area in order to generate a test tone.

The mixing apparatus according to the embodiments of the present invention has a mix bus which is an ST bus, and an output channel which is an ST output channel. As a general mixer, however, the mixing apparatus of the present invention may have a plurality of mix buses and a plurality of output channels corresponding to the mix buses, respectively. In this case, however, the mixing apparatus is provided with level control portions for the respective mix buses in order to allow individual level control.

In a case where a message saying “out of adjustable range” is displayed on the MESSAGE box of a target channel on the automatic correction screen, furthermore, the mixing apparatus may allow the user to display the input channel control screen to specify again to increase the delay time which is to be set for the channel delay means 42 of the reference channel so that the time difference between the audio signal input to the target channel and the audio signal input to the reference channel will fall within the adjustable range. By carrying out the measurement and automatic correction process again, the audio signal of even the target channel which had the message saying “out of adjustable range” can be automatically corrected to coincide with the phase of the audio signal input to the reference channel.

What is claimed is:

1. A mixing apparatus having a plurality of input channels which receive a plurality of audio signals from a plurality of microphones, respectively, the mixing apparatus controlling characteristic of the input audio signals in the input channels, respectively, mixing the audio signals received by the input channels to obtain a mixed audio signal and then outputting the mixed audio signal, the mixing apparatus comprising:

a plurality of delay portions which are provided for the input channels, respectively, and delay the input audio signals, respectively;

a first designation portion which designates one of the input channels as a reference channel;

a second designation portion which designates at least one of the input channels as a target channel;

a time difference detector which detects a time difference of timing at which the target channel receives an audio signal representative of a test tone generated by a single tone generator and collected by one of the microphones which supplies audio signals to the target channel, from timing at which the reference channel receives an audio signal representative of the test tone collected by another one of the microphones which supplies audio signals to the reference channel; and a delay controller which controls the respective delay portions provided for the reference channel and the target channel in accordance with the time difference, detected by the time difference detector, in the timing at which the audio signals are received so that the difference in the timing at which the reference channel and the target channel receive the audio signals, respectively, will be eliminated.

2. The mixing apparatus according to claim 1, wherein the reference channel and the target channel are designated by user’s manipulation.

3. The mixing apparatus according to claim 1, wherein the characteristic of audio signals is frequency characteristic, level characteristic, and phase characteristic of the audio signals.

4. The mixing apparatus according to claim 1, wherein the time difference detector is formed of:

a counter which sequentially changes counted value at each predetermined timing to measure time; and a calculator which calculates the time difference in the timing at which the audio signals are received in accordance with a difference between a counted value counted by the counter when the audio signal representative of the test tone input to the reference channel rises and a counted value counted by the counter when the audio signal representative of the test tone input to the target channel rises.

5. The mixing apparatus according to claim 1, wherein the time difference detector is formed of:

a storage portion which sequentially stores a tone volume change curve or the audio signal representative of the test tone input to the reference channel and a tone volume change curve or the audio signal representative of the test tone input to the target channel concurrently in parallel with the passage of time at a predetermined rate with respect to predetermined timing; and a calculator which calculates the time difference in the timing at which the audio signals are received in accordance with a difference between a storage position of rising timing of the tone volume change curve or the audio signal which is representative of the test tone input to the reference channel and is stored in the storage portion, and a storage position of rising timing of the tone volume change curve or the audio signal which is representative of the test tone input to the target channel and is stored in the storage portion.

6. The mixing apparatus according to claim 5, wherein the predetermined timing is timing which is earlier by a certain period of time than the earliest one of the rising timings of the test tone input to the reference channel and the target channel, respectively.

7. The mixing apparatus according to claim 1, wherein the time difference detector is formed of:

a storage portion which sequentially stores a tone volume change curve or the audio signal representative of the test tone input to the reference channel and a tone volume change curve or the audio signal representative of the test tone input to the target channel concurrently in parallel with the passage of time at a predetermined rate with respect to predetermined timing;

a display portion which displays, on a time axis, the tone volume change curves or the audio signals representative of the test tone input to the reference channel and the target channel and stored in the storage portion, respectively;

a moving portion which moves, in accordance with user's manipulation for making the respective rising timings of the tone volume change curves or the audio signals of the test tone input to the reference channel and the target channel and displayed on the display portion coincide with each other, the tone volume change curve or the audio signal of the test tone input to the reference channel or the target channel and displayed on the display portion along the time axis; and a calculator which calculates, by use of amount of move of the tone volume change curve or the audio signal of the test tone along the time axis by the moving portion, the time difference in the timing at which the audio signals are received.

8. The mixing apparatus according to claim 7, wherein the predetermined timing is timing which is earlier by a certain period of time than the earliest one of the rising timings of the test tone input to the reference channel and the target channel, respectively.

9. The mixing apparatus according to claim 1, wherein the time difference detector is formed of:

a storage portion which sequentially stores a tone volume change curve or the audio signal representative of the test tone input to the reference channel and a tone volume change curve or the audio signal representative of the test tone input to the target channel concurrently in parallel with the passage of time at a predetermined rate with respect to predetermined timing;

a basic time difference calculator which calculates, as a basic time difference, a time difference between a storage position of rising timing of the tone volume change curve or the audio signal representative of the test tone input to the reference channel and stored in the storage portion, and a storage position of rising timing of the tone volume change curve or the audio signal representative of the test tone input to the target channel and stored in the storage portion;

a display portion which displays, on a time axis, the tone volume change curves or the audio signals representative of the test tone input to the reference channel and the target channel and stored in the storage portion, respectively, with the basic time difference calculated by the basic time difference calculator being resolved;

a moving portion which moves, in accordance with user's manipulation for making the respective rising timings of the tone volume change curves or the audio signals of the test tone input to the reference channel and the target channel and displayed on the display portion coincide with each other, the tone volume change curve or the audio signal of the test tone input to the reference channel or the target channel and displayed on the display portion along the time axis; and a correction portion which calculates, by correcting the basic time difference calculated by the basic time difference calculator by use of the amount of move of the tone volume change curve or the audio signal of the test tone moved along the time axis by the moving portion, the time difference in the timing at which the audio signals are received.

10. The mixing apparatus according to claim 9, wherein the predetermined timing is timing which is earlier by a certain period of time than the earliest one of the rising timings of the test tone input to the reference channel and the target channel, respectively.

11. The mixing apparatus according to claim 1, wherein the time difference detector is formed of:

a storage portion which sequentially stores the audio signal representative of the test tone input to the reference channel and the audio signal representative of the test tone input to the target channel concurrently in parallel with the passage of time at a predetermined rate with respect to predetermined timing; and a calculator which calculates a cross-correlation value for judging degree of agreement between the audio signal representative of the test tone input to the target channel and the audio signal representative of the test tone input to the reference channel, while displacing time of the audio signal representative of the test tone input to either the reference channel or the target channel and stored in the storage portion, and calculates the time difference in the timing at which the audio signals are received, by use of amount of displacement of time which obtains the best agreement of the calculated cross-correlation value.

12. The mixing apparatus according to claim 11, wherein the predetermined timing is timing which is earlier by a certain period of time than the earliest one of the rising timings of the test tone input to the reference channel and the target channel, respectively.

13. A non-transitory computer-readable medium storing a computer program applied to a mixing apparatus having a plurality of input channels which receive a plurality of audio signals from a plurality of microphones, respectively, the plurality of input channels having a plurality of delay portions for delaying the input audio signals, respectively, the mixing apparatus controlling characteristic of the input audio signals in the input channels, respectively, mixing the audio signals received by the input channels to obtain a mixed audio signal and then outputting the mixed audio signal, the computer program causing a computer to implement the program comprising the steps of: a first designation step of designating one of the input channels as a reference channel; a second designation step of designating at least one of the input channels as a target channel; a time difference detection step of detecting a time difference of timing at which the target channel receives an audio signal representative of a test tone generated by a single tone generator and collected by one of the microphones which supplies audio signals to the target channel, from timing at which the reference channel receives an audio signal representative of the test tone collected by another one of the microphones which supplies audio signals to the reference channel; and a delay control step of controlling the respective delay portions for the reference channel and the target channel in accordance with the time difference, detected by the time difference detection step, in the timing at which the audio signals are received so that the difference in the timing at which the reference channel and the target channel receive the audio signals, respectively, will be eliminated.

* * * * *